(12) United States Patent
Farnworth et al.

(10) Patent No.: US 6,441,628 B1
(45) Date of Patent: Aug. 27, 2002

(54) CSP BGA TEST SOCKET WITH INSERT AND METHOD

(75) Inventors: Warren M. Farnworth, Nampa; Derek J. Gochnour; David R. Hembree, both of Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,749

(22) Filed: Aug. 29, 2001

Related U.S. Application Data

(62) Division of application No. 09/234,593, filed on Jan. 21, 1999.

(51) Int. Cl.[7] ............................................... G01R 31/02
(52) U.S. Cl. ...................................... 324/755; 324/765
(58) Field of Search ............................ 324/73.1, 158.1, 324/754, 755, 765; 438/16–18; 439/66, 70, 71; 29/846, 852

(56) References Cited

U.S. PATENT DOCUMENTS

| | | |
|---|---|---|
| 4,501,461 A | 2/1985 | Anhalt |
| 4,527,850 A | 7/1985 | Carter |
| 5,073,117 A | 12/1991 | Malhi et al. |
| 5,088,930 A | 2/1992 | Murphy |
| 5,177,439 A | 1/1993 | Liu et al. |
| 5,364,286 A | 11/1994 | Matsuoka |
| 5,475,317 A | 12/1995 | Smith |
| 5,490,795 A | 2/1996 | Hetzel et al. |
| 5,493,237 A | 2/1996 | Volz et al. |
| 5,495,179 A | 2/1996 | Wood et al. |
| 5,504,436 A | 4/1996 | Okutsu |
| 5,518,410 A | 5/1996 | Masami |
| 5,519,332 A | 5/1996 | Wood et al. |
| 5,528,463 A | 6/1996 | McLellan et al. |
| 5,531,608 A | 7/1996 | Abe |
| 5,532,612 A | 7/1996 | Liang |
| 5,574,383 A | 11/1996 | Saito et al. |
| 5,647,756 A | 7/1997 | Twigg et al. |
| 5,731,709 A | 3/1998 | Pastore et al. |
| 5,870,820 A | 2/1999 | Arakawa et al. |
| 5,952,840 A | 9/1999 | Farnworth et al. |
| 6,018,249 A | 1/2000 | Akram et al. |
| 6,208,156 B1 * | 3/2001 | Hembree ................ 324/755 |
| 6,262,581 B1 | 7/2001 | Han |

OTHER PUBLICATIONS

*B400 BGA Carrier*, Bear Technology, LLC. 1997, (3 pages). Month Unavailable.
*Loranger Ball Grid Array (BGA)*, (1 page). Month, Year Unavailable.
*OZ Tek BGA Sockets*, (2 pages). Month, Year Unavailable.
*Yamaichi's IC264 Socket for Test & Burn–In (169/225 Pin BGA)*, (2 pages). Month, Year Unavailable.
*Yamaichi's IC51/IC53 QFP, PQFP, & LCC Socket for Test & Burn–In (Clamshell Style)*, (1 page). Month, Year Unavailable.
*Yamaichi's NP276 Socket for Test & Burn–In (119 Pin BGA)*, (2 pages). Month, Year Unavailable.

* cited by examiner

Primary Examiner—Michael J. Sherry
Assistant Examiner—Minh N. Tang
(74) Attorney, Agent, or Firm—TraskBritt

(57) ABSTRACT

A BGA test socket for use in standard testing and burn-in testing of BGA dies and method for testing such dies is disclosed wherein a die contact insert made of silicon or ceramic using standard IC fabrication technology is used. Through using such an insert, even small scale (pitch) BGA dies can be reliably tested including chip scale packaged ("CSP") BGA dies. Furthermore, using such an insert allows a conventional socket to be adapted for use with a wide variety of both BGA dies and other varieties. A method for using the device is disclosed which overcomes current static electricity problems experienced in testing CSP BGA dies through closing the test socket before removing the die deposit probe.

7 Claims, 7 Drawing Sheets

CSP BGA TEST SOCKET WITH INSERT AND METHOD

CROSS-REFERENCE TO RELATED APPLICATION

This application is a divisional of application Ser. No. 09/234,593, filed Jan. 21, 1999, pending.

BACKGROUND OF THE INVENTION

1. Field of the Invention

This invention relates generally to testing or burn-in sockets and carriers for semiconductor dies and, more specifically, to an apparatus and method for testing dies which use ball grid array ("BGA") technology, wherein the socket or carrier includes retaining elements, a force system, and a removable die contact insert capable of interfacing with chip scale package ("CSP") BGA dies received within the carrier.

2. State of the Art

Semiconductor dies are used in virtually every electronic device because they are versatile and compact. In fact, each year technology advances, allowing for smaller semiconductor dies and resulting in smaller electronic devices. Although semiconductor dies are functional at the time they are created, inherent manufacturing defects, caused by factors such as contamination or process variability, are generally expected in some percentage of dies. Dies with inherent manufacturing defects have shorter lifetimes than dies without such defects and are the largest contributors to early-life failure rates, or "infant mortality". Semiconductor manufacturers perform test processes to discover dies with these types of inherent manufacturing defects and achieve a lower early-life failure rate, thereby increasing product reliability.

"Burn-in" refers to the process of accelerating early-life failures. This is done by cycling a semiconductor die through a series of stresses at raised temperature designed to simulate extreme field conditions to cause failure of the die and remove those dies which would have otherwise failed during early field use. Typical burn-in begins by placing a semiconductor die package into a socket containing probes or terminals for connecting to all electrical inputs and outputs of the die. Testing includes pre-burn-in and post-burn-in testing as well as burn-in testing. Many sockets in the art can be used for many forms of testing and can be either permanently connected to a testing center, or may act as a carrier which is easily moved and attached to one or more different testing centers for various tests.

One concern in relation to BGA die test sockets is that the semiconductor die be held in the socket securely enough to maintain a valid testing process through sufficient continuous electrical communication between the socket and the die, yet not so securely held that the die or its electrical connections are damaged. Examples of test sockets which hold dies with leads in place can be found in U.S. Pat. No. 5,504,436 (Okutsu, 1996), and U.S. Pat. No. 5,088,930 (Murphy, 1992). However, these sockets only work to hold the die in place if the electrical connections are of specific given types, namely extending leads. Examples of test sockets which hold BGA dies in place can be found in U.S. Pat. No. 5,531,608 (Abe, 1996), and U.S. Pat. No. 5,518,410 (Masami, 1996). However, none of these conventional sockets can adequately test CSP BGA dies because the array of terminals in a CSP BGA die is significantly smaller and of finer pitch (i.e., spacing between ball centers) than larger scale BGA dies.

A second concern, related to the first, is that the test probes used within a socket have sufficient rigidity and conductive capacity to accurately test the die. As semiconductor dies and their conductive elements get smaller, testing of those dies gets more difficult. For example, the test probes used to communicate with the BGA die conductive element array in U.S. Pat. No. 5,518,410 to Masami and U.S. Pat. No. 5,531,608 to Abe, although apparently sufficient for larger scale BGA dies, are not practical for use with CSP BGA dies due to the fine pitch array of minute balls employed. Using known materials and technology to make the probes small enough to distinctly test each conductive element (ball) in the array creates test probes which are insufficiently rigid and/or have insufficient conductive capacity. If test probes are insufficiently rigid, they may bend or break, causing the socket to perform an inaccurate test process. Furthermore, if the test probes have insufficient conductive capacity, they may fail or give inaccurate results. Current technology does not yet permit manufacture of probes small enough to adequately test CSP BGA dies while maintaining the required probe rigidity and conductive capacity.

A third concern in relation to test sockets is minimizing the number of automated operations required to load and unload a socket, yet maintain simplicity of socket design. Many conventional sockets and carriers used for testing nonpackaged and nonencapsulated dies include multiple parts or parts which must be disassembled to insert or remove a die from the socket or carrier, thus requiring additional automated steps. An example of a carrier with an assembly which must be disassembled to insert or remove a die is disclosed in co-owned U.S. Pat. No. 5,519,332 to Wood et al. (May 21, 1996), herein incorporated by reference. One advantage of using a carrier which must be disassembled, such as that disclosed by Wood et al., is there are fewer moving parts than in carriers which do not require disassembly for use and, thus, less opportunity for mechanical failure. Carriers and sockets in the current art for testing BGA dies which do not require disassembly to insert and remove dies, although they require fewer automated operations, also contain many moving parts. This presents greater opportunity for malfunction and error.

A fourth concern in relation to test sockets used in automated test processes is to avoid lids or other socket parts which protrude so far they interfere with the automated processes. Many sockets in the art for testing BGA dies include hinged lids which extend well beyond, or above, the socket and thus may be broken off during automated processes. This result is clearly undesired, as it causes delay, causes possible equipment damage, adds expense for repair, and causes lower die yield.

A fifth concern in dealing with BGA dies in test sockets is the build-up of static electricity on the equipment. Current BGA interface die test processes typically include the steps of opening the socket, placing the die within the socket, releasing the die, then closing the socket.

Although this may work for larger scale BGA devices which are sufficiently heavy to overcome the static electricity created between the releasing device and the die, it may not work for CSP BGA die test processes. A specific problem experienced more often when testing CSP BGA dies is that static causes the dies to stick to the releasing device instead of remaining in the socket.

It would be advantageous to have a die socket and carrier for use with CSP BGA interface dies which holds the die within the socket, has few moving measuring parts, does not require disassembly to insert and remove a die, has a low profile lid and has terminals adequate to accurately interface with and test a CSP BGA die. Furthermore, it would be advantageous to have a method for testing BGA dies which overcomes the static electricity problem.

BRIEF SUMMARY OF THE INVENTION

According to the present invention, a test socket assembly is disclosed wherein a removable die contact insert, having terminals of sufficient number and disposed to distinctly and accurately interface with and test a CSP BGA die, is disposed within the test socket containing retaining elements and a force system. In general, the invention includes a test socket assembly comprising an electrically insulating base containing a die contact insert and electrically insulating die retaining elements which, in cooperation with the base, apply pressure against the back side of a BGA die to maintain continuous contact between the conductive element array of the die and an array of electrically conductive contacts or terminals on the die contact insert. By operating the retaining elements appropriately, the socket may be opened to insert or remove a BGA die from the socket.

In a particular and preferred aspect of the invention, the die contact insert comprises electric terminals in an array in mirrored orientation to that of the conductive elements of a CSP BGA die and is dimensioned such that each conductive element in the array is discretely connected to the socket in electrical communication sufficient to test the die. In one embodiment, the die contact insert is removable and interchangeable. In this way, versatility is afforded for multiple conductive element array configurations using the same socket. In a more simple embodiment, the die contact insert is affixed to or integral with the base. In another embodiment, the electric terminals are wells having electrically conductive material which extend in conductive paths to a peripheral side of the die contact insert. The paths are then adapted to communicate with a testing station or other external station. Such an adaptation allows for mobility and easier connection to the station. In still another embodiment, the electric terminals of the die contact insert employ conductive paths to communicate with a corresponding external interface integral with the base. Such base external interface can then be fit into an existing socket of a bum-in board or otherwise connected to a testing station.

In another particular and preferred aspect of the invention, a vertical force is used to assist in maintaining sufficient continuous electrical contact between the BGA die terminals and the die contact insert. In one preferred embodiment, the vertical force is applied by the combination of an insulating plate suspended and urged toward a retaining element by at least one spring. The die contact insert is disposed between the insulating plate and the BGA die such that when the socket is closed, vertical force is exerted toward the BGA die, causing it to remain in substantially continuous electrical contact with the die contact insert. In another preferred embodiment, the retaining element comprises retention tongs which move between open and closed positions by applying or releasing pressure on a tong activating frame. In still another embodiment, the upper member comprises a clamshell lid, spring-loaded latch and resilient foam member. When the clamshell lid is moved into the closed position over a die, the resilient foam member applies downward pressure on the die. Yet another embodiment comprises retention tongs, each having an end affixed to at least one spring urging the retention tong toward the base. Thus, a force is applied from the tongs to any die placed within the socket. The socket is opened and closed by applying pressure on a tong activating frame which moves the retention tongs into an appropriate position. In still yet another embodiment, a low-profile lid is pivotally attached to the insert to open or close the socket and is held closed by a latch. Using a lid allows for a portable robust package which may be transferred between various test processes. Using a lowprofile lid, the robust package may be used in automated processes more easily and with less risk that the lid will be broken off.

A method for testing CSP BGA dies is also disclosed wherein the static electricity problem experienced in prior art is overcome. According to the method, a BGA die is brought above a vertical compression test socket by a die deposit probe surrounded by a sufficiently rigid sleeve. The sleeve is independently lowered to apply a vertical force to a retaining element activating mechanism, thus opening the socket. The die deposit probe then lowers the die into, and aligned with, the socket containing an insert for accommodating that particular CSP BGA die. Instead of then removing the probe as is currently done in the art, the sleeve is withdrawn to close the socket. With the die held in place, the die deposit probe is then withdrawn. The die is removed by reversing the previous steps.

Other features, advantages, and objects of the present invention will become apparent from a consideration of the drawings and ensuing description.

BRIEF DESCRIPTION OF THE SEVERAL VIEWS OF THE DRAWINGS

In the drawings, which depict presently preferred embodiments of the invention and in which like reference numerals refer to like parts in different views:

FIG. 4 also depicts a probe and sleeve with the housing partially removed to show socket operation.

DETAILED DESCRIPTION OF THE INVENTION

Figure 1:
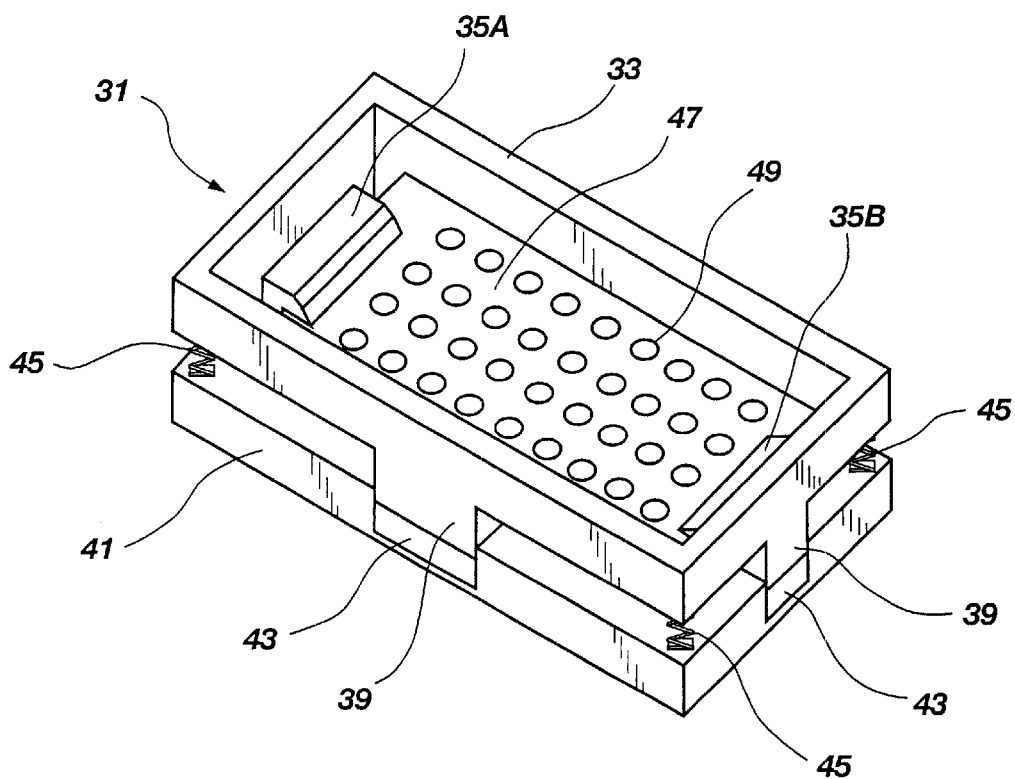
FIG. 1 is a perspective view of an IC socket according to one embodiment of the invention.

FIG. 1 depicts a preferred test socket 31 according to the invention for use in BGA die test processes. This socket is operated by applying a vertical force or pressure to a tong activating frame 33, thus compressing the socket 31 and causing retaining elements 35A and 35B (embodied here as tongs 35A and 35B) to pivot outwardly sufficient to permit a BGA die 37 (see FIG. 4) within the socket 31. Preferably, socket guides 39, integral with the tong activating frame 33, are slidably associated with a base 41 having corresponding guide slots 43 to ensure the tong activating frame 33 and the base 41 are securely aligned during operation to prevent tilting, twisting and jamming of the cooperating components. When pressure is released from the tong activating frame 33, socket closing springs 45 urge the tong activating frame 33 upward, causing the tongs 35A and 35B to pivot inward.

Conventional vertical compression IC sockets are well known in the art. Specific examples of the mechanics of vertical compression sockets are described in U.S. Pat. No. 5,364,286 to Matsuoka (1994), and 5,531,608 to Abe (1996), herein incorporated by reference. No further description is believed to be necessary in regard to the mechanics and operation of conventional vertical compression sockets. While it is contemplated that some conventional vertical compression sockets might be modified to work with the insert the inventors have disclosed, conventional vertical compression sockets still maintain the aforementioned disadvantages. According to the present invention, a die contact insert 47 containing an array of electrical terminal wells 49 resides inside a simplified socket 31 to provide support and a sufficient communication path between a BGA die 37 (see FIG. 4) and the test socket 31.

Figure 2:
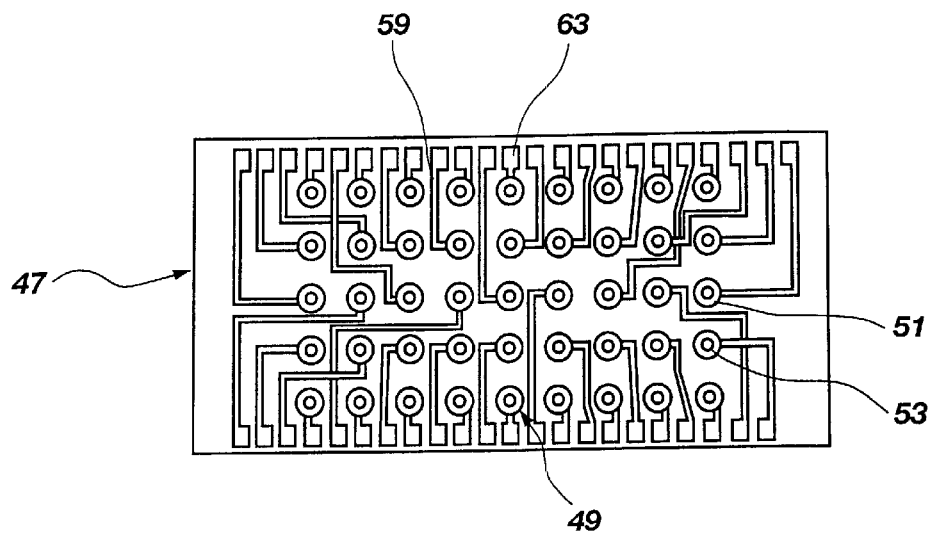
FIG. 2 is a top view of a die contact insert according to one embodiment of the invention showing a terminal well array and traces extending to peripheral bond pads.

FIG. 2 depicts a top view of a preferred embodiment of the die contact insert 47 containing the array of terminal wells 49. The die contact insert 47 with its array of terminal wells 49 can be manufactured as small as is needed from silicon or ceramic using IC fabrication techniques known in the art. The terminal wells 49 each preferably have an opening 51 wider than the well bottom 53 to ensure contact when a conductive element configured as a ball 55 (see FIG. 4) from a BGA die 37 is placed in the terminal well 49 and accommodate some variance. This results in a terminal well 49 having a cross-section with a trapezoidal shape 61 (See FIG. 3). A trapezoidal cross-section is achieved preferably with an inverted truncated conical or inverted truncated pyramidal shape. Although it is preferred, a trapezoidal cross-section is not required for accurate testing. Other cross-sectional shapes such as a square, half circle, rectangle, or other shapes which allow the balls 55 (see FIG. 4) of the BGA die 37 (see FIG. 4) to contact a conductive surface of the terminal well 49 are sufficient. The dimensions of each terminal well 49 and the spacing (pitch) between each terminal well 49 are respectively dependent upon the dimensions of the balls 55 used and the spacing (pitch) of the balls 55 on the BGA die 37. No single dimension or array spacing (pitch) is sufficient for every variety of BGA die arrangement. However, for any given BGA die arrangement, one of ordinary skill in the art may easily calculate the necessary dimensions and spacing (pitch) for the terminal well array 49. By using IC fabrication techniques, each terminal well 49 can be manufactured for electrical communication with the socket 31. One way this may be accomplished is by lining each terminal well 49 with a conductive material 69 such as a metal. Such techniques are well known in the art.

Figure 3:
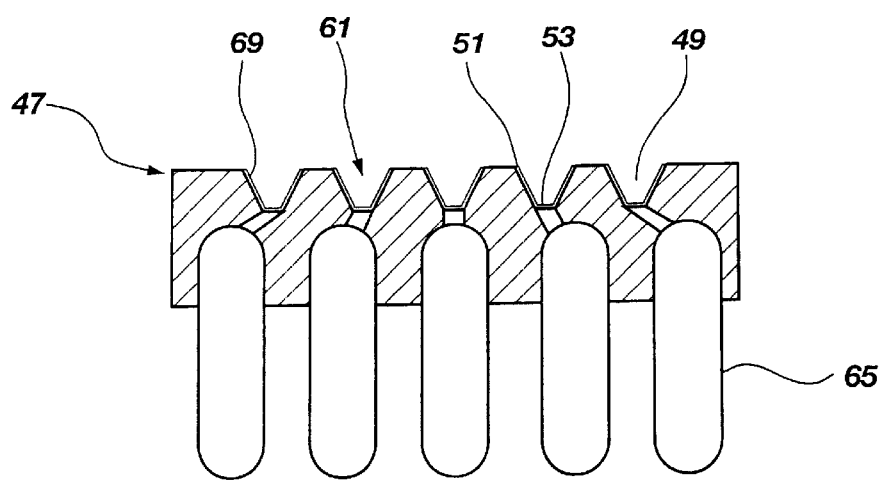
FIG. 3 is a sectional view of one embodiment of the die contact insert showing a preferred cross-sectional shape for the wells.
Figure 12:
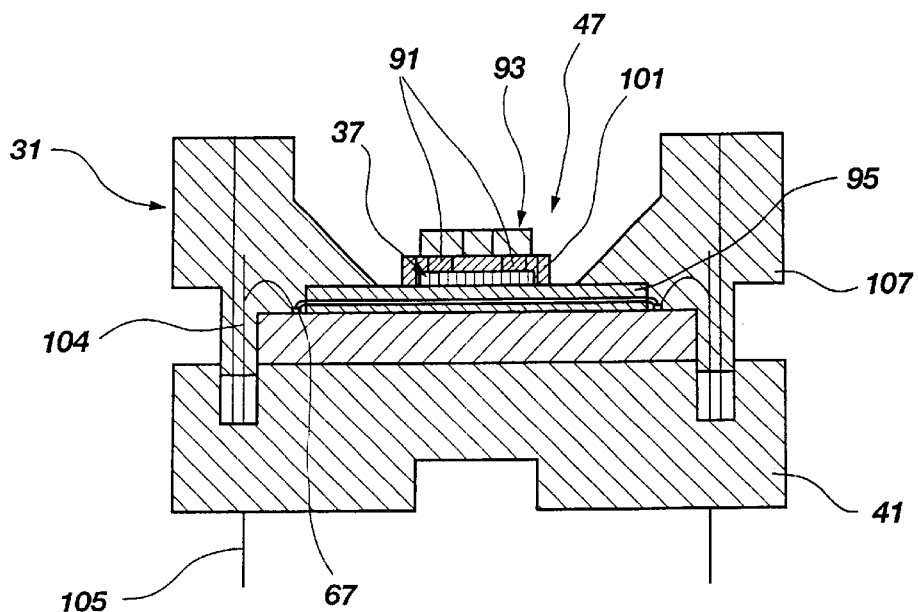
FIG. 12 is a sectional view of the die carrier insert having gull-wing leads disposed in a TSOP socket where a portion of the housing has been removed to show the carrier.

As should be clear from the above description, by using IC fabrication techniques well known in the art, the die contact insert 47 can be manufactured with many different forms of external contacts and interfaces. By way of example only, depending on the type of contact or interface needed for a given socket 31, the die contact insert 47 can be manufactured simply to have aluminum traces 59 extending to bond pads 63, as shown in FIG. 2, which can then be wire bonded out to conductors carried on the socket body, or have pins 65 receivable in a standard socket, as shown in FIG. 3, to a lead frame 67 employing J-leads or gull wings, as shown in FIG. 12, or to a larger BGA interface or adaptor board for connection to a socket made for another device.

FIGS. 4–8 depict the operation of one preferred embodiment of the invention.

Figure 4:
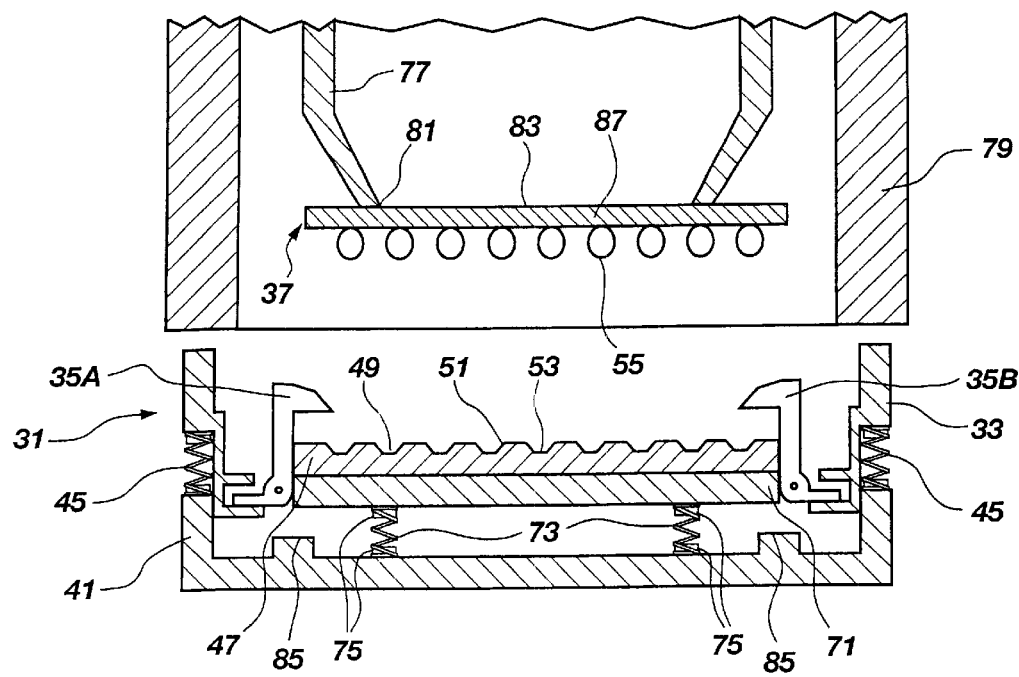
FIG. 4 is a sectional view of one embodiment of the socket with portions of the base, tong activating frame, plate and die contact insert removed to expose the die contact insert wells.
Figure 5:
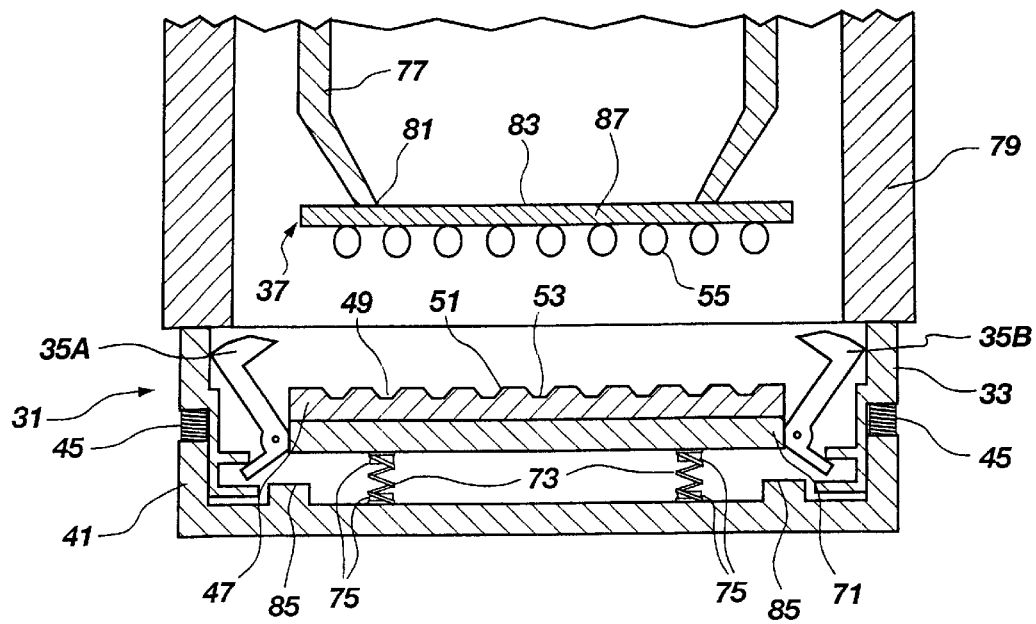
FIG. 5 is a view similar to FIG. 4 showing the socket open before a BGA die is deposited.

According to this embodiment, an IC test socket 31 is manufactured for use with CSP BGA dies 37 using a die contact insert 47. The die contact insert 47 is supported from its underside by an electrically insulating plate 71 borne by at least one and preferably a plurality of plate support springs 73 held in place by wrapping each spring around opposing, aligned spring nodes 75 located on the bottom of the plate 71 and on the inside of the base 41 directly below the plate spring nodes 75. During operation, a probe 77 carrying a CSP BGA die 37 and surrounded by a probe sleeve 79 is brought above an empty test socket 31 (FIG. 4). The die 37 is preferably held to the probe tip 81 by suction applied through an aperture 83 in the probe tip 81, but other means known in the art are also adequate. For example, multiple probes having multiple probe tips comprising vacuum quills may alternatively be used. Once the probe 77 and surrounding probe sleeve 79 are directly above the socket 31, the probe sleeve 79, which is sufficiently rigid and of sufficient dimensions to contact the tong activating frame 33 and compress the socket 31, applies pressure to the tong activating frame 33 to compress the socket 31 and open the tongs 35A and 35B (FIG. 5). For reliable operation, the probe sleeve 79 of the probe 77 carrying the CSP BGA die 37 preferably extends beyond the BGA die 37 to prevent the die 37 from being knocked loose from the probe 77 or damaged while the socket 31 is being opened. Furthermore, the dimensions of the tongs 35A and 35B, although not particularly significant to the operation of the socket 31, are selected so as to not interfere with the probe 77, die 37, or probe sleeve 79 during operation of the socket 31.

Figure 6:
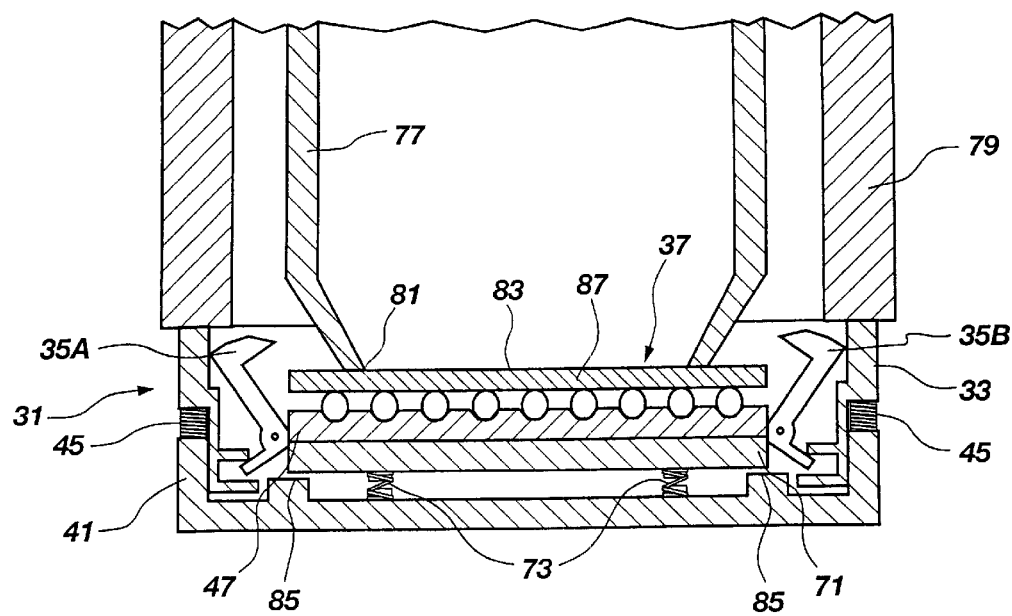
FIG. 6 is a view similar to FIG. 4 showing the socket open after a BGA die is deposited.

Once the socket 31 is compressed and open, the probe 77, which moves independently of the probe sleeve 79, lowers a CSP BGA die 37 into the socket 31 so that the ball array 55 aligns with the mirrored array of terminal wells 49 on the die contact insert 47 (FIG. 6). Because the plate support springs 73 urge the plate 71 upward, preferably with enough force that the die 37 in a closed socket 31 is pressed firmly between the tongs 35A and 35B and the die contact insert 47, the probe 77 preferably applies pressure to the die 37 once in the socket 31 to sufficiently depress the plate support springs 73 for the tongs 35A and 35B to close over the die 37. To avoid damage to the plate support springs 73 or other elements of the socket by establishing a limit for the probe's 77 extension into the socket, plate, stops 85 are preferable.

Figure 7:
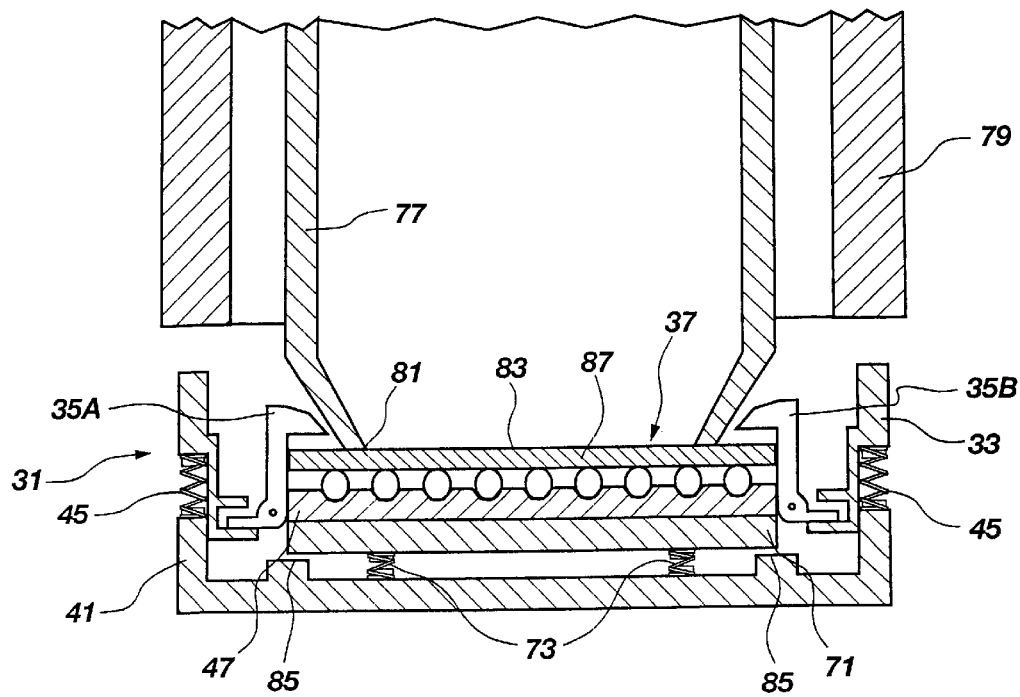
FIG. 7 is a view similar to FIG. 4 showing the socket closed after depositing a BGA die, but before removing the probe.
Figure 8:
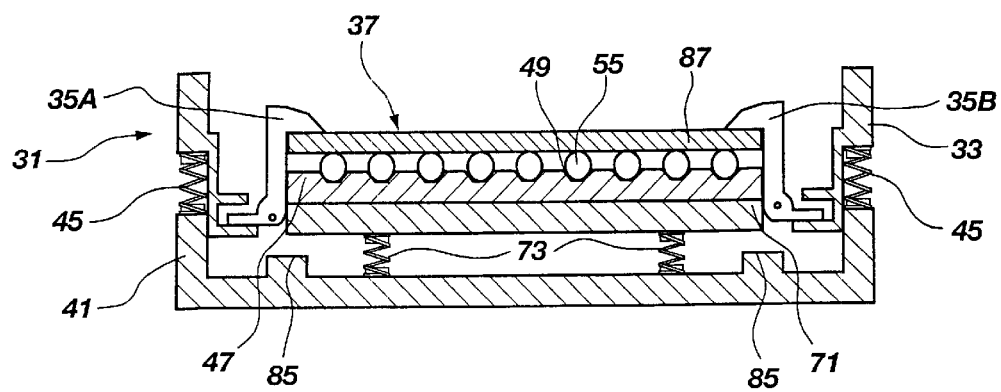
FIG. 8 is a view similar to FIG. 4 showing the socket closed after depositing a BGA and removing the probe.

After CSP BGA die 37 is securely seated on the die contact insert 47, but before the probe 77 is withdrawn, the probe sleeve 79 is withdrawn and the closing springs 45 urge the tong activating frame 33 into its rest position. This causes the tongs 35A and 35B to pivot back to their position above the BGA die 37 (FIG. 7). The probe 77 is then withdrawn, releasing the die 37 (FIG. 8). With the plate support springs 73 urging the plate 71 and die contact insert 47 toward the die balls 55 and the tongs 35A and 35B exerting equal, opposite force against the die substrate 87, the die balls 55 are preferably held against the terminal wells 49 in substantially continuous electrical communication throughout the test processes. Also, by closing the tongs 35A and 35B before removing the probe 77, any static electric charge built up between the probe 77 and the die substrate 87 is overcome when) the probe 77 is withdrawn; the die 37 remains in the socket 31.

Figure 9:
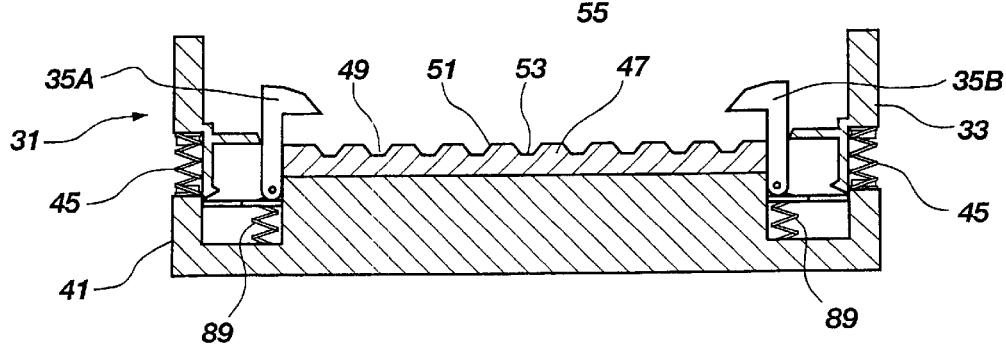
FIG. 9 is a view similar to FIG. 4, but illustrating a second embodiment of the socket.
Figure 10:
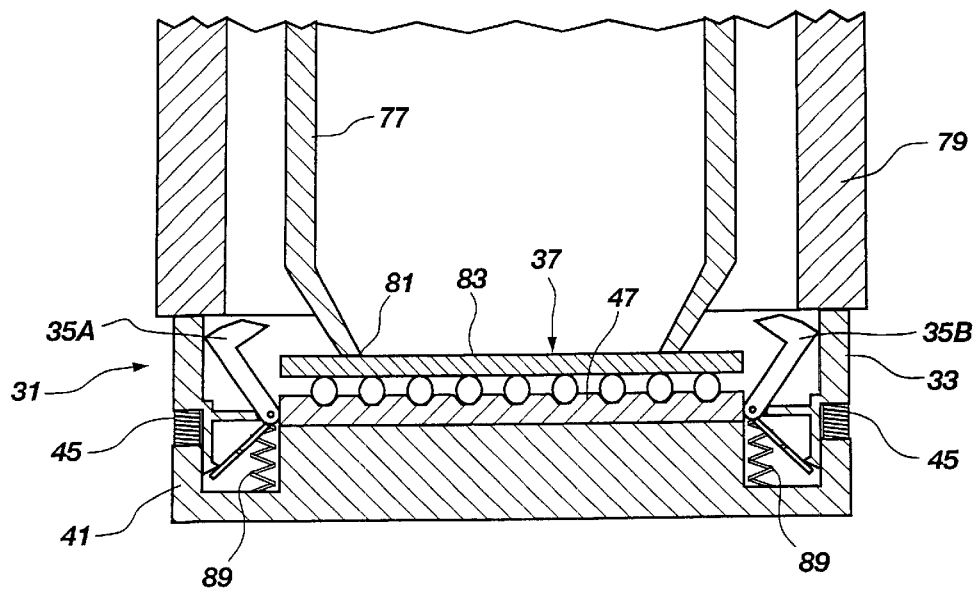
FIG. 10 is a view similar to FIG. 4, but illustrating a second embodiment of the socket open after depositing a BGA die.

FIGS. 9–10 illustrate a second embodiment of the invention to show that although it is preferable to have force applied within the socket 31 to hold the die balls 55 against the terminal wells 49 for sufficiently continuous electrical communication throughout test processes, such pressure need not come solely from plate support springs 73 (see FIG. 8) urging the die contact insert 47 toward the tongs 35A and 35B. At least one other option is to attach coiled tong springs 89 in tension to the tongs 35A and 35B at a point on each of the tongs 35A and 35B such that without any lateral support, such as provided by tong activating frame 33 in FIG. 9, the tongs 35A and 35B would rotate away from the die 37. Such coiled tong springs 89 can thereby pull the tongs 35A and 35B against the die substrate 87 to force the die balls 55 into substantially continuous electrical contact with the terminal wells 49 when the socket is closed. As shown in FIG. 10, when the socket 31 is compressed, the tong activating frame 33, which moves independently of the tongs 35A and 35B, forces the tongs 35A and 35B upward contrary to the tension provided by the coiled tong springs 89. Due to the manner in which the coiled tong springs 89 are attached to the tongs 35A and 35B, the tongs rotate away from the die when tong activating frame 33 reaches a point in relation to the tongs 35A and 35B where lateral support for the tongs 35A and 35B is no longer provided. When the pressure on the socket 31 is released, the tongs 35A and 35B are pulled back down into the socket 31, are again given lateral support by the tong activating frame 33, rotate back toward the die 37, and again apply pressure to the die 37.

Figure 11:
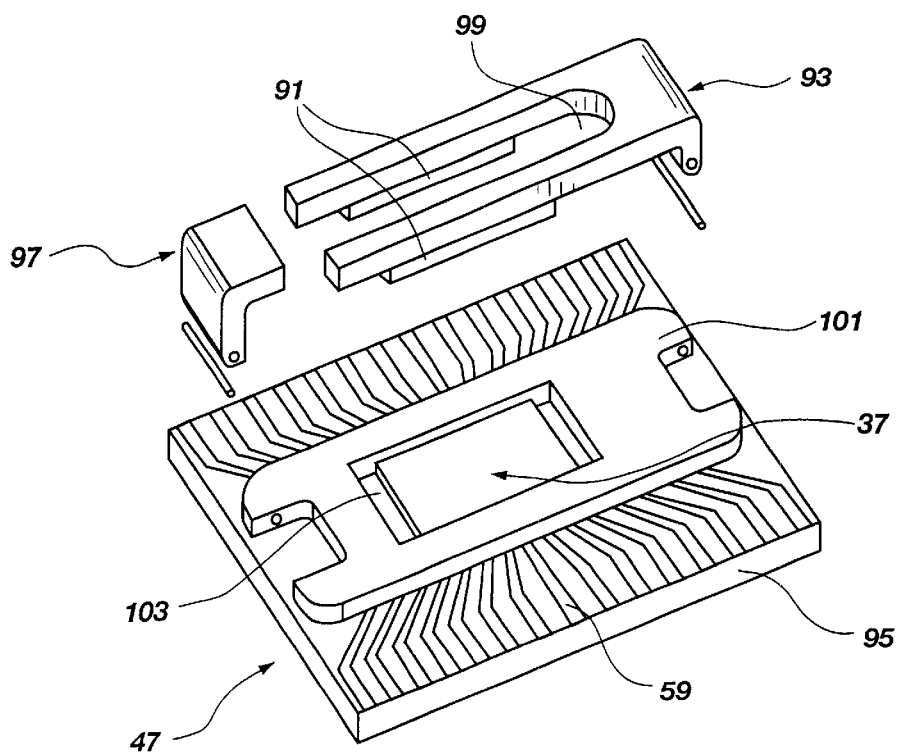
FIG. 11 is a perspective view of a die carrier insert according to a third embodiment of the present invention.

FIGS. 11–12 depict a third embodiment of the invention wherein a die contact insert 47 for use in testing CSP BGA die 37, using existing larger-scale sockets, contains a force mechanism 91 and lid 93 within the die contact insert 47. According to this embodiment, a die contact insert substrate 95, manufactured using IC fabrication techniques, is disclosed wherein the die contact insert 47 also includes a clamshell lid 93 and spring-loaded latch 97, rotationally spring-loaded so as to close when released, for holding a CSP BGA die 37 in place for easy transfer of this die contact insert 47 from one test station to another. A probe opening 99 is included in the lid 93 so the lid 93, like the tongs 35A and 35B in previous embodiments, can be closed before withdrawing the probe 77 to overcome any static electricity built up between the probe 77 and the die 37. The clamshell lid 93 used in this embodiment also comprises a resilient force system such as springy foam force mechanism 91 (e.g., an air-filled elastomer), which applies pressure to secure the CSP BGA die balls 55 (not shown, see FIG. 9) against the array of terminal wells 49 (not shown, see FIG. 9) exposed on the upper surface of the die contact insert substrate 95. In the present embodiment, a die contact insert lid adaptor 101 is used to attach the clamshell lid 93 and spring loaded latch 97 to the die contact insert substrate 95. As can be seen in FIG. 11, the die contact insert lid adaptor 101 can also be used to provide additional support and protection for the BGA die 37 by extending the die contact insert lid adaptor 101 across the die contact insert substrate 95, leaving an aperture 103 in which to insert the BGA die 37. As will be obvious from the discussion herein, the die contact insert 47 can be manufactured having the terminal wells 49 contained within the die contact insert substrate 95, or an additional removable die contact insert can be created and placed upon the die contact insert substrate 95 for additional flexibility of design and application.

Thus, an appropriately sized and adapted die contact insert 47 can be placed in an existing conventional socket 31. FIG. 12 depicts a die contact insert 47 according to the embodiment described in relation to FIG. 11, but having a lead frame and gull-wing leads 67 and being deposited in a conventional TSOP socket 31. The TSOP socket 31 depicted in FIG. 12 includes a socket activating mechanism 107, a socket base 41, and die contact leads 104 in electrical communication with external pins 105. By using a die contact insert 47 which comprises a lid 93 and force mechanism 91, the die contact insert 47 and BGA die 37 can more easily be transferred between pre-burn-in, burn-in, and post burn-in test processes using existing equipment and processes. The die contact insert 47 further allows CSP BGA dies 37 to be tested reliably.

Figure 13:
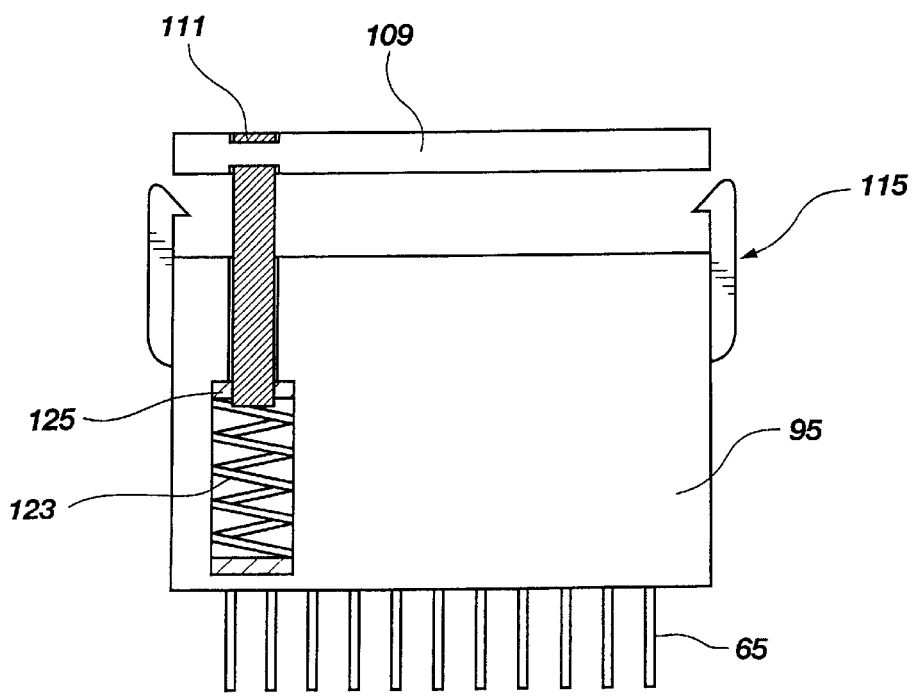
FIG. 13 is a sectional view of a die carrier insert according to an embodiment of the invention with a portion of the external casing removed to show an uploaded spring and pivot rod attached to the rotating lid.

FIG. 13 depicts a fourth embodiment of the invention wherein a die contact insert 47 for use in testing CSP BGA die 37 using existing sockets is also used as a carrier for a CSP BGA die 37 throughout the various stages of testing. According to the embodiments shown, a die contact insert substrate 95 is manufactured using IC fabrication techniques. To such substrate 95, a rotating lid 109 and latch 115 are attached to allow a CSP BGA die to be deposited onto and removed from the die contact insert 47 (not shown, see FIG. 12). As will be clear to one of ordinary skill in the art, various forms of rotating lids 109, latches 115, and external contacts 65 may be substituted for those depicted in the embodiment of FIG. 13 without departing from the nature of the invention. Preferably, the pivot 111 includes an uploaded pivot spring 123 to urge the lid 109 upward above the spring-loaded latches 115 and stop upward It is contemplated that the various elements of this invention are not restricted to any particular size or shape. For example, although most conventional sockets in the industry are square or rectangular in shape, suggesting a square or rectangular shaped insert would be most appropriate, it is contemplated that such inserts need not be square or rectangular, or of similar size to currently known BGA dies. An insert need only be of a size sufficient to be deposited in a given socket. The terminal wells, although preferably wells which extend below the surface of the insert lined with aluminum, copper or other conductive substance such as metal, can also be flat pads made of similar substances which rest on the surface of the insert, provided the BGA die is sufficiently held in place in alignment over the pads by the tongs, or by some other retaining element or guide.

It is also contemplated that the various interfaces between the insert and different sockets are not restricted to a particular method. For example, electronic communication between an insert and a semiconductor socket can be accomplished using various interfaces including, but not limited to, pins, leads, BGAs, bond pads with wiring, and direct wiring. It is also contemplated that such an insert may be removable, like the embodiments shown, or fixed to the socket by adhesive or other means. Although it is contemplated that this invention will be of primary benefit to the art by providing a device and method to reliably test CSP BGA dies, it is intended that this device may also apply to testing large pitch BGA dies or other dies for adapting a socket to test a different size, interface, or type of die.

As will be clear to one of ordinary skill in the art, one general advantage of using an insert within a socket is the ability to adapt existing sockets for use in testing BGA dies, and testing BGA dies with varying pitch, ball dimensions and array configurations using the same socket. As will also be clear to one of ordinary skill in the art, an advantage of using an insert manufactured of silicon or ceramic is the ability to create a durable array of rigid contact terminals of any desired shape or electronic property using IC fabrication techniques which can withstand the rigid testing processes applied to semiconductor dies and provide a compatible coefficient of thermal expansion (CTE) to the die material. Another advantage is the ability to create a dense array of precise wells for use with CSP BGA dies where other types of manufacturing techniques are inadequate. Using an insert such as the ones described here, a CSP BGA die can be adapted for use with standard board pitch, thus overcoming previously experienced testing problems.

Although the invention has been described with regard to certain preferred embodiments, the scope of the invention is not limited by these embodiments and is to be defined by the appended claims.

What is claimed is:

1. A test socket for a semiconductor die using a ball grid array interface comprising:

a base;

at least one die retaining mechanism operably associated with the base, the at least one die retaining mechanism including at least one die retaining element;

at least one biasing element coupled between the at least one die retaining mechanism and the base to effect engagement and disengagement of the at least one die retaining element with the semiconductor die; and a die contact insert moveably secured to the base, the die contact insert comprising:

a substrate;

a plurality of wells formed in a top surface of the substrate;

a conductive lining on a portion of each well; and a conductive element extending from the conductive lining on the portion of each well, each conductive element being configured to be operatively coupled with external circuitry;

wherein the at least one die retaining element is a lid.

2. The test socket of claim 1, wherein the lid is a clamshell lid which, when in a closed position, is held closed by a spring biased latch.

3. The test socket of claim 1, wherein the lid comprises a force member for applying pressure against the semiconductor die within the test socket when the lid is in a closed position.

4. The test socket of claim 3, wherein the force member comprises resilient foam.

5. The test socket of claim 1, wherein the lid is configured to rotate with respect to the base until fixed above the base by at least one latching member.

6. The test socket of claim 5, wherein the lid is configured to rotate about a pivoting member located proximate a peripheral edge of the lid.

7. The test socket of claim 5, wherein the lid further comprises a spring member urging the lid upward.

\* \* \* \* \*

UNITED STATES PATENT AND TRADEMARK OFFICE
CERTIFICATE OF CORRECTION

PATENT NO. : 6,441,628 B1
DATED : August 27, 2002
INVENTOR(S) : Warren M. Farnworth, Derek J. Gochnour and David R. Hembree It is certified that error appears in the above-identified patent and that said Letters Patent is hereby corrected as shown below:

Column 3,
Line 43, change "bum-in" to -- burn-in --

Column 6,
Line 64, delete the comma after "plate"

Column 7,
Line 14, change "when)" to -- when --

Column 8,
Line 43, after "upward" insert -- movement with a pivot spring stop 125. --

Signed and Sealed this

Seventh Day of September, 2004

JON W. DUDAS
*Director of the United States Patent and Trademark Office*